US006327678B1

(12) United States Patent
Nagai

(10) Patent No.: US 6,327,678 B1
(45) Date of Patent: Dec. 4, 2001

(54) SKEW ADJUSTING METHOD IN IC TESTING APPARATUS AND PSEUDO DEVICE FOR USE IN THE METHOD

(75) Inventor: Hiroyuki Nagai, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/286,358

(22) Filed: Apr. 5, 1999

(30) Foreign Application Priority Data

Apr. 3, 1998 (JP) .................................................. 10-091727

(51) Int. Cl.[7] .............................. G06K 5/04; G11B 5/00;
G11B 20/20; G01R 31/28; G06F 11/00
(52) U.S. Cl. ........................... 714/700; 714/731; 714/735
(58) Field of Search ................... 714/700, 731, 714/735

(56) References Cited

U.S. PATENT DOCUMENTS

| 5,491,728 | * | 2/1996 | Verhille et al. | 375/362 |
|---|---|---|---|---|
| 5,513,377 | * | 4/1996 | Capowski et al. | 710/61 |
| 5,629,880 | * | 5/1997 | Negishi | 702/85 |
| 5,675,265 | * | 10/1997 | Yamamori | 327/3 |
| 5,703,515 | * | 12/1997 | Toyama et al. | 327/294 |
| 5,727,021 | * | 3/1998 | Truebenbach | 375/226 |
| 5,745,533 | * | 4/1998 | Asada et al. | 375/354 |
| 5,811,655 | * | 9/1998 | Hashimoto et al. | 73/1.42 |
| 6,158,030 | * | 12/2000 | Reichle et al. | 714/724 |
| 6,184,736 | * | 2/2001 | Wissell et al. | 327/295 |

FOREIGN PATENT DOCUMENTS

| 3719176 | | 12/1988 | (DE) . | |
|---|---|---|---|---|
| 19636916 | | 3/1997 | (DE) . | |
| 0566823 | | 10/1993 | (EP) . | |
| 0566823-A2 | * | 10/1993 | (EP) | G01R/31/318 |
| 6 3153100 | | 6/1988 | (JP) . | |
| 0 3033800 | | 2/1991 | (JP) . | |
| 408154089-A | * | 6/1996 | (JP) | H04L/7/00 |

* cited by examiner

Primary Examiner—Albert Decady
Assistant Examiner—Joseph D. Torres
(74) Attorney, Agent, or Firm—David N. Lathrop, Esq.; Gallagher & Lathrop

(57) ABSTRACT

There are provided a skew adjusting method capable of accurately conducting a skew adjustment in an IC testing apparatus comprising a plurality of pin cards and an IC socket, and a pseudo device for use in the skew adjusting method. Any one 11N of the pin cards 11A to 11N which are connected to terminals of the IC socket respectively, is defined as a reference pin card. A plurality of pseudo devices 12 are prepared, each of which electrically connects to the reference pin card 11N one of the remaining pin cards through the IC socket when that pseudo device is mounted thereon. The pseudo devices are sequentially mounted on the IC socket to connect all drivers DR of the remaining pin cards one by one to a voltage comparator $CP_N$ of the reference pin card. And variable delay circuits DRY1 and DRY2 of each pin card are adjusted so that a delay in phase of the driver of each pin card may coincide with a delay in phase defined as a reference.

6 Claims, 9 Drawing Sheets

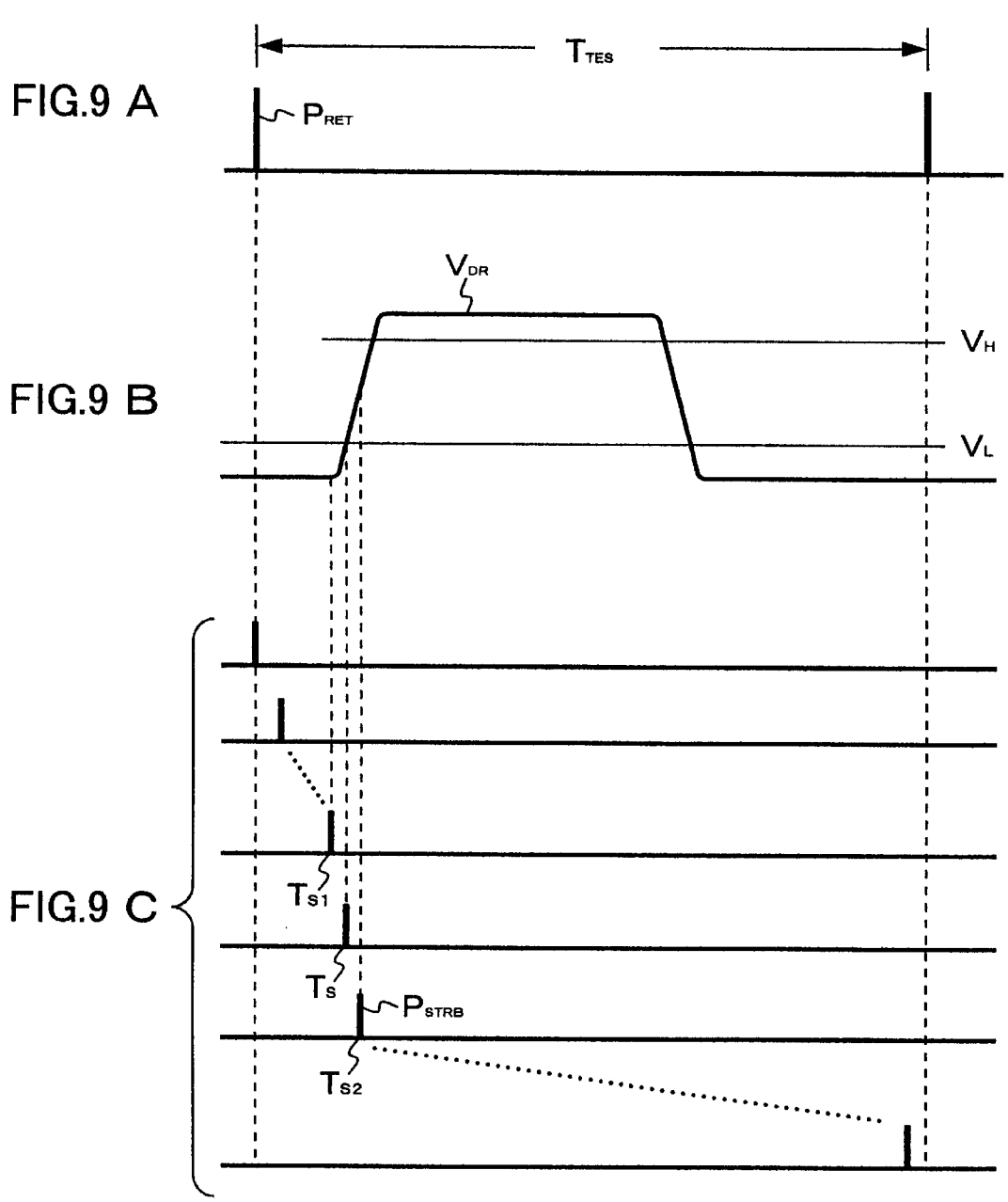

US 6,327,678 B1

SKEW ADJUSTING METHOD IN IC TESTING APPARATUS AND PSEUDO DEVICE FOR USE IN THE METHOD

BACKGROUND OF THE INVENTION

1. Field of the Invention

The present invention relates to a skew adjusting method in an IC testing apparatus for testing various kinds of semiconductor integrated circuits (each referred to as IC, hereinafter) and determining whether they are defectless (pass) or defective (failure), and more particularly, to an adjusting method for conforming the timing at which a test pattern signal is applied to each of terminals of an IC under test and the timing at which a response output signal outputted from the IC under test is fetched or read out, to a predetermined set value for each terminal, called skew adjusting method in this field (hereinafter referred to skew adjusting method), and a pseudo device which is used in this skew adjusting method.

2. Description of the Related Art

In an IC testing apparatus for testing ICs such as, for example, memories, it is conventional that an adjustment in which the timing for applying a test pattern signal to each of input terminals (a data input terminal and an address input terminal) of an IC under test and the timing for reading out a response output signal from an output terminal of the IC under test or an 110 terminal of the IC under test in its output mode are conformed to a predetermined set value for each terminal, is periodically conducted. This adjustment is commonly called skew adjustment In this technical field.

In a test head of the IC testing apparatus, there is housed a printed board, called a pin card in this field, which contains, for example, a driver for applying a test pattern signal to an IC under test through an IC socket mounted on top of the test head, and a comparator for comparing a response output signal fetched through the IC socket from the IC under test with an expected value signal, and the like. The printed board will hereinafter be referred to as pin card. Usually there are housed a plurality of pin cards the number of which corresponds to the number of terminals (pins) of an IC under test. FIG. 3 schematically depicts, by way of example, the circuit configuration of such a pin card. Since pin cards 11A, 11B, 11C, . . . , 11N have the same circuit configuration with one another, there is shown in FIG. 3 the circuit configuration of only the pin card 11A. The pin cards 11A through 11N are each designed so that when they are placed in the test head at predetermined positions thereof, the output terminals of the drivers are electrically connected to an IC socket and one input terminal of each of the comparators is electrically connected to the IC socket.

As depicted in FIG. 3, the pin card 11A comprises a waveform generator FF, a driver DR for amplifying a test pattern signal generated by the waveform generator FF and applying the amplified test pattern signal to an IC under test via a terminal $P_1$ of an IC socket 10, and a voltage comparator CP for comparing a response output signal from the IC under test with an expected value signal.

The IC socket 10, to which the IC under test (not shown) is to be electrically connected, has terminals (pins) $P_1$, $P_2$, $P_3$, . . . , $P_N$ corresponding in number to terminals (pins) of the IC under test to which the terminals $P_1$ to $P_N$ are connected. To the terminates $P_1$ to $P_N$ are each connected the output terminal of the driver DR and one input terminal of the voltage comparator CP of the corresponding one of the pin cards 11A to 11N.

The waveform generator FF is formed, in this example, by an S-R flip-flop provided with a set terminal S and a reset terminal R. When supplied at its set terminal S with a set input signal PSET (shown in FIG. 4B) from an input terminal SET of the pin card 11A via a variable delay circuit DRY1, the S-R flipflop FF generates a driving signal $V_{DR}$ that goes to a logical H (high level) as depicted in FIG. 4D.

On the other hand, when supplied at its reset terminal R with a reset input signal $P_{RESET}$ (shown in FIG. 4C) from an input terminal RESET of the pin card 11A via a variable delay circuit DRY2, the S-R flip-flop FF makes the driving signal VDR L-logic (lowlevel) as depicted in FIG. 4D.

In this way, the S-R flip-flop FF generates the driving signal $V_{DR}$ in response to the application thereto of the set input signal $P_{SET}$ and the reset input signal $P_{RESET}$. The driving signal VDR is amplified by the driver DR, from which it is fed as a test pattern signal via the corresponding terminal P1 of the IC socket 10 to the corresponding input terminal (an address input terminal and a dedicated input terminal, or an Input terminal of a combination I/O terminal in the input mode) of the IC under test. Needless to say, the waveform generator FF is not limited specifically to the S-R flipflop but may also be formed by other devices or circuits as long as they serve the intended purpose.

The set input signal $P_{SET}$ and the reset input signal $P_{RESET}$ are delayed for $\tau_1$ and $\tau_2$, respectively, relative to the generation timing of period pulses $P_{RET}$ that define the test period $T_{TES}$ as shown in FIG. 4A, and then they are input into the set input terminal SET and the reset input terminal RESET of each of the pin cards 11A to 11N. The delay times r and $\tau_2$ are determined by the condition for the generation of the test pattern.

Now, assuming that the delay times of the set and reset input signals PSET and PRESET fed to the input terminals SET and RESET of all the pin cards 11A to 11N are $\tau_1$ and $\tau_2$ depicted in FIGS. 4B and 4C, respectively, test pattern signals ought to be applied in the same phase (at the same timing) to the respective terminals $P_1$ to $P_N$ of the IC socket 10.

In practice, however, due to variations in the line lengths between the pin cards 11A to 11N and the corresponding terminals $P_1$ to $P_N$ of the IC socket 10, or by some other cause, the signal propagation delay time $T_{pd}$ shown in FIG. 3 varies accordingly, resulting in variations In the timing of arrival of the driving signals VDR at the terminals P1 to PN of the IC socket 10. To accommodate the variations in this timing and hence ensure in-phase application of the test pattern signals to the IC socket, the pin cards 11A to 11N are each provided with the aforementioned variable delay circuits DRY1 and DRY2. By controlling the delay times of the variable delay circuits DRY1 and DRY2, the phases of the driving signals $V_{DR}$ to be supplied to all the terminals $P_1$ to $P_N$ of the IC socket 10 are adjusted into coincidence with the phases of the set and reset input signals $P_{SET}$ and $P_{RESET}$ fed to the input terminals SET and REST of the pin cards 11A to 11N. This is the aforementioned skew adjustment.

In addition, when there are variations in the propagation delay time $T_{pd}$ between the pin cards 11A to 11N and the corresponding terminals of the IC socket 10, variations also result in the propagation time for the response output signal read out of the IC under test to reach the voltage comparator CP of the corresponding one of the pin cards 11A to 11N. To accommodate the variations, there is placed l variable delay circuit DRY3 in a path over which a strobe pulse $P_{STRB}$ is supplied to the voltage comparator CP via a strobe input terminal STRB of each pin card, by which skew adjustments are made on the voltage comparator CP side as well.

Next, a description will be given of conventional skew adjusting methods on the driver DR side and on the voltage comparator CP side.

Conventionally, to make skew adjustments on the driver DR side, a standard voltage comparator STDCP is provided as standard phase detecting means as shown in FIG. 3; output terminals of the pin cards 11A to 11N are selectively connected via a relay matrix RMAX to the standard voltage comparator STDCP in a sequential order to make the skew adjustment for each of the pin cards 11A to 11N. The skew adjustment for the pin card 11A will be described below by way of example.

The standard voltage comparator STDCP is provided with first and second comparators $CP_1$ and $CP_2$ as depicted in FIG. 5. The comparators $CP_1$ and $CP_2$ form a window comparator. In the standard voltage comparator STDCP the first comparator $CP_1$ outputs L or H logic, depending on whether an input signal $V_X$ is larger or smaller than a comparison (reference) voltage $V_H$. On the other hand, the second comparator $CP_2$ outputs L or H logic, depending on whether the input signal $V_X$ is smaller or larger than a comparison voltage $V_L$. Accordingly, by monitoring the logical values provided at output terminals TVH and TVL of the standard voltage comparator STDCP, it is possible to detect what relationships the input signal $V_X$ bears to the comparison voltages $V_H$ and $V_L$.

Assume that the voltage relationships between the comparison voltages $V_L$ and $V_H$ and the input signal $V_X$ are set, for example, such that voltages a little higher than the L-logic level and a little lower than the H-logic level of the input signal $V_X$ are the comparison voltages $V_L$ and $V_H$, respectively, as shown in FIG. 6B. Further, let it be assumed that the phase of a reference clock CLK, which is applied as a strobe pulse to each of the comparators $CP_1$ and $CP_2$, is shifted for each test period $T_{TES}$ (FIG. 6A) in a sequential order of $CLK_1$, $CLK_2$, . . . , $CLK_N$ as depicted in FIG. 6C, thereby shifting the timing of comparison by the comparators $CP_1$ and $CP_2$ In this instance, when the voltage of the input signal $V_X$ is lower than the comparison voltage $V_L$, L logic and H logic are provided at the output terminals TVL and TVH, respectively. When the voltage of the input signal $V_X$ is intermediate between the comparison voltages $V_H$ and $V_L$, H logic is provided at both of the output terminals TVL and TVH. When the voltage of the input signal $V_X$ is higher than the comparison voltage $V_H$, H logic and L logic are provided at the output terminals TVL and TVH, respectively. Thus, the state of the input signal VX can be known by monitoring the logical values that are provided at the output terminals TVL and TVH of the standard voltage comparator STDCP. The skew adjustment on the driver DR side is an adjustment that detects, for example, the timing of the rise edge of the input signal $V_X$ through utilization of such characteristics of the voltage comparators, then measures the delay time of the input signal $V_X$ based on the detected timing of its rise edge, and sets the delay times of the variable delay circuits DRY1 and DRY2 so that the delay time of the input signal $V_X$ becomes as predetermined.

More specifically, according to the conventional method for making the skew adjustment on the driver DR side, the delay times of the variable delay circuits DRY1 and DRY2 are preset at reference values (for example, at central values of the variable delay time widths), then the set and reset input signals $P_{SET}$ and $P_{RESET}$ set to be delayed by predetermined time intervals, for example, by the time intervals $\tau_1$ and $\tau_2$ shown in FIG. 4, are input into the delay circuits, and the driving signal $V_{DR}$ is provided from the driver DR.

On the other hand, the IC socket 10 is held disconnected from the IC under test, and is caused to reflect a signal at the terminal $P_1$. As a result, the standard voltage comparator STDCP is supplied with a direct wave $R_{X1}$ output from the driver DR and a reflected wave $R_{X2}$ delayed by a time interval $T_Q$ twice longer than the propagation delay time $T_{pd}$ between the pin card 11A and the terminal $P_1$ of the IC socket 10 as depicted in FIG. 7C.

Hence, the comparison voltages $V_H$ and $V_L$ of the standard voltage comparator STDCP are set at levels that cross a timing point $T_1$ in the rise edge of the direct wave $R_{X1}$ and a timing point $T_2$ in the fall edge of the reflected wave $R_{X2}$ as depicted in FIG. 7C. And the phase of the reference clock CLK, which is applied as the strobe pulse $P_{STRB}$ to the standard voltage comparator STDCP, is slightly shifted for each test period $T_{TES}$ in a sequential order of $P_{STRB1}$, $P_{STRB2}$, . . . , $P_{STRBn}$ as depicted in FIG. 7D. By this, It is possible to detect the timing $T_1$ and $T_2$ of arrival of the direct wave $R_{X1}$ and the reflected wave $R_{X2}$ at the standard voltage comparator STDCP. Based on the thus detected timing $T_1$ and $T_2$, the time difference $T_Q$ between the direct wave $R_{X1}$ and the reflected wave $R_{X2}$ can be detected. By dividing the time difference $T_Q$ by 2, it is possible to determine the propagation delay time $T_{pd}$ between the pin card 11A and the terminal $P_1$ of the IC socket 10.

The above measurement is carried out for each pin card to determine the propagation delay time $T_{pd}$. Then, for example, the central value in the range of variations in the propagation delay time $T_{pd}$ is set as a reference value, and the deviation of the actually measured propagation delay time $T_{pd}$ from the reference value is computed for each pin card. And a delay time corresponding to the computed deviation is set in each of the variable delay circuits DRY1 and DRY2 of the respective pin cards 11A to 11N, with which the skew adjustment on the driver side is completed.

This is followed by adjusting the comparison timing of the voltage comparators CP mounted on the pin cards 11A to 11N. The voltage comparator CP of each pin card may be identical in construction with the standard voltage comparator STDCP depicted in FIG. 5. By setting the comparison voltage $V_L$ at a voltage slightly above the L-logic level, it is possible to detect the timing of the rise edge of the driving signal $V_{DR}$ that the driver DR outputs.

In concrete terms, the adjustment of the timing of comparison by the voltage comparator CP is made by: inputting the driving signal $V_{DR}$, shown In FIG. 9B, directly into the voltage comparator CP from the driver DR; detecting timing $T_S$ at which the rise edge of the driving signal $V_{DR}$ crosses the comparison voltage $V_L$ depicted in FIG. 9B; and setting the detected timing $T_S$ in the variable delay circuit DRY3 provided in the supply path of the strobe pulse $P_{STRB}$ from the strobe input terminal STRB to the voltage comparator CP on each pin card as shown in FIG. 8. That is, the variable delay circuit DRY3 is set in what is called a through state, then the timing $T_S$ of arrival thereto of the driving signal $V_{DR}$ from the driver DR is measured, and the delay time of the variable delay circuit DRY3 is set such that the measured timing $T_S$ coincides with the delay time $\tau_1$ of the set signal $P_{SET}$ By this, the detected timing of the voltage comparator CP can be made to coincide with the delay time on the driver DR side. In FIG. 8 the parts and elements corresponding to those in FIG. 3 are identified by the same reference characters.

As described above, the traditional skew adjusting method utilizes the reflected wave particularly for the skew adjustment on the driver side, and in addition, provides the reflected wave via the relay matrix RMAX to the standard voltage comparator STDCP to measure the delay of phase or delay of the reflected wave between the driver DR and each of the terminals $P_1$ to $P_N$ of the IC socket 10; hence, the conventional method has a defect that no accurate delay of phase can be measured.

In other words, the relay matrix RMAX is used only to connect the standard voltage comparator STDCP to the pin cards 11A to 11N during the skew adjustment, and is not used for IC test. Besides, it is switched to connect the standard voltage comparator STDCP to the drivers DR of the respective pin cards one after another; hence, if the delay time by the relay matrix RMAX varies with Its switching, then an error is caused in the propagation delay time between the driver DR and each pin P of the IC socket which is measured for each pin card 11. Since there is no real chance that there is no difference in the line lengths between the relay matrix RMAX and the respective pin cards, the delay time by the relay matrix RMAX varies with its switching. Therefore, it is difficult to implement accurately-in-phase application of test pattern signals from all the pin cards 11A to 11N to the corresponding terminals $P_1$ to $P_N$ of the IC socket 10.

Because of inaccurate skew adjustment on the driver side as mentioned above, the skew adjustment for the voltage comparator CP based on it also lacks accuracy.

SUMMARY OF THE INVENTION

It is therefore an object of the present invention to provide a skew adjusting method which is capable of accurately conducting skew adjustments on both of the driver side and the voltage comparator side.

An another object of the present invention is to provide a pseudo device which is suitable for use in a skew adjusting method which is capable of accurately performing skew adjustments on both of the driver side and the voltage comparator side.

In order to attain the above objects, in one aspect of the present invention, there is provided a skew adjusting method for adjusting a skew in an IC testing apparatus which comprises a plurality of pin cards and at least one IC socket, each of said pin cards being provided with at least one driver for supplying a test pattern signal to an IC under test and comparator means for logically comparing a response output signal from the IC under test with a predetermined value, the method of adjusting a skew in each of the pin cards comprising the steps of: defining the comparator means provided in any one of said pin cards as reference detecting means; preparing a plurality of pseudo devices each of which electrically connects, when mounted on said IC socket, the pin card provided with said reference detecting means to at least one of the remaining pin cards through said IC socket; and sequentially mounting said plurality of pseudo devices on said IC socket to connect all of the remaining pin cards one after another to said reference detecting means, and adjusting the driving timing of the driver of each of the remaining pin cards to the detected timing of said reference detecting means.

In a preferred embodiment, the skew adjusting method further comprises the steps of: defining any one of the drivers of said pin cards, the driving timing thereof being adjusted to the detected timing of said reference detecting means, as a reference driver; and supplying a driving signal outputted from said reference driver to each of the remaining pin cards through an associated pseudo device, and adjusting the detected timing of the comparator means of each of the remaining pin cards to the driving timing of said reference driver.

The comparator means of each of said pin cards is a voltage comparator for determining whether the response output signal outputted from the IC under test has a predetermined logical L voltage or logical H voltage, and said step of adjusting the driving timing of the driver of each of the remaining pin cards to the detected timing of said reference detecting means is a step of measuring the rise timing and the fall timing of the driving signal outputted from the driver of each pin card, and adjusting the driving timing of the driver of each pin card to a central value of the measured rise timings or the measured fall timings.

In addition, the number of said pin cards is equal to the number of terminals of said IC socket, and each of said plurality of pseudo devices is provided with one connection line built therein, said connection line connecting, when each pseudo device is mounted on said IC socket, the terminal thereof to which said pin card having said reference detecting means is connected to one of the remaining terminals of the IC socket through that pseudo device.

In a second aspect of the present invention, there is provided a pseudo device for use in the skew adjusting method as set forth in the above, which has substantially the same configuration as that of the IC under test and is provided with at least one connection line built therein for connecting a specified terminal of said IC socket to at least one of the remaining terminals thereof when said pseudo device is mounted on said IC socket.

According to the present invention, one of plural pin cards is chosen to define it as a reference pin card, and pseudo devices are sequentially connected in order to the IC socket to connect the drivers of all of the remaining pin cards one after another to the voltage comparator of the reference pin card through that pseudo device mounted on the IC socket, and the delay of phase on the driver side of each of the pin cards is directly measured using the voltage comparator of the reference pin card.

Since the delay of phase on the driver side of each pin card can thus be measured with high accuracy, it is possible to conduct an accurate skew adjustment on the driver side of every pin card. Moreover, such accurate skew adjustment on the driver side of each pin card results in an advantage that a skew adjustment for the voltage comparator can also be conducted with high accuracy.

BRIEF DESCRIPTION OF THE DRAWINGS

FIG. 9 is a waveform diagram for explaining the operation of the circuit depicted in FIG. 8.

DETAILED DESCRIPTION OF THE PREFERRED EMBODIMENTS

Figure 1:
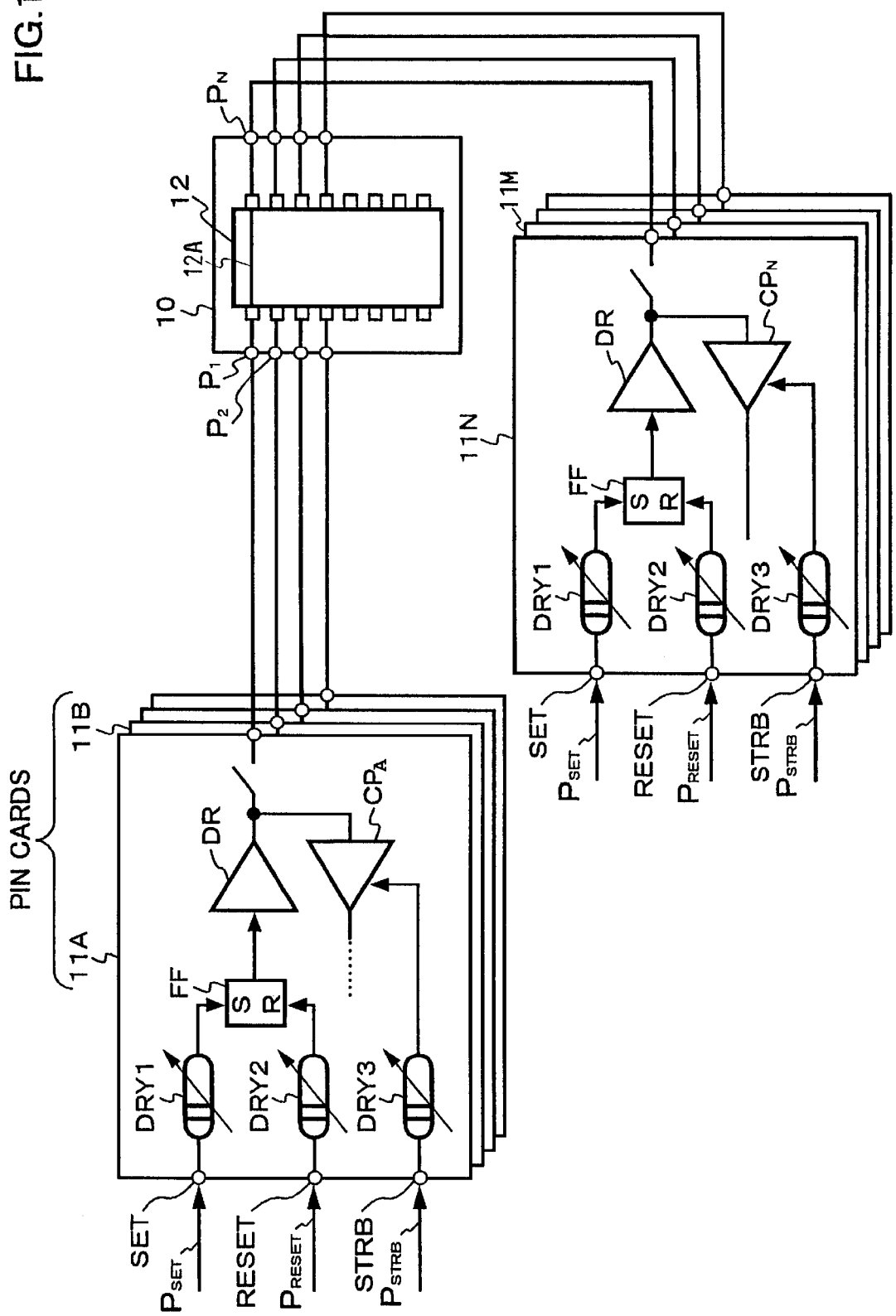
FIG. 1 is a block diagram illustrating a portion of an IC testing apparatus including pin cards, for explaining the skew adjusting method according to the present invention and a pseudo device for use in the method.

A detailed description will be given, with reference to FIGS. 1 and 2, of an embodiment of the skew adjusting method according to the present invention and embodiments of pseudo devices useful for the method. In FIG. 1 the parts and elements corresponding to those in FIG. 3 are identified by the same reference numerals and characters, and no description will be repeated thereon unless required.

FIG. 1 is a circuit diagram illustrating a portion of an IC testing apparatus including pin cards, for explaining the skew adjusting method according to the present invention and a pseudo device for use in the method. Pin cards 11A to 11N have the same circuit configuration. Each of the pin cards 11A and 11N depicted as typical examples in FIG. 1 comprises, as is the case with the conventional pin card 11A shown in FIG. 3, a waveform generator FF; a driver DR which amplifies a test pattern signal generated by the waveform generator FF and applies the amplified signal to an IC under test (not shown) via a terminal $P_1$ and $P_N$ of an IC socket 10 respectively, a voltage comparator CP which fetches a response output signal from the IC under test and compares it with an expected value signal, a variable delay circuit DRY1 provided in the path of supply of a set input signal $P_{SET}$ from an input terminal SET to a set terminal S of the waveform generator FF; a variable delay circuit DRY2 provided in the path of supply of a reset input signal PRESET from a reset input terminal RESET to a reset terminal R of the waveform generator FF, and a variable delay circuit DRY3 provided in the path of supply of a strobe pulse $P_{STRB}$ from a strobe input terminal STRB to the voltage comparator CP.

In the present invention, one of the pin cards 11A to 11N that are connected to the terminals $P_1$ to $P_N$ of the IC socket 10, respectively, is chosen as a reference pin card. A pseudo device 12, which establishes electrical connections between that one of the terminals of the IC socket to which the reference pin card is connected and another terminal of the IC socket connected to any other given pin card, is mounted on the IC socket 10 to connect the driver of the given pin card to the reference pin card, and the voltage comparator of the reference pin card is used to measure the delay of phase or delay on the driver side of the given pin card. Following this, such pseudo devices 12 are sequentially exchanged to connect the drivers of all the remaining pin, cards to the reference pin card, and the voltage comparator of the reference pin card is used to measure delay of phases on the driver side of all the other pin cards In the Illustrated embodiment, the pin card 11N connected to the terminal $P_N$ of the IC socket 10 is chosen as the reference pin card, and its voltage comparator $CP_N$ is used to sequentially measure the delay of phases on the driver DR side of all the other pin cards 11A to 11M while exchanging the pseudo devices 12 one after another. To begin with, in the case of measuring the delay of phase on the driver DR side of the pin card 11A connected to the terminal $P_1$ of the IC socket 10 through the use of the voltage comparator $CP_N$ of the reference pin card 11N, the pseudo device 12 that interconnects the terminals $P_1$ and $P_N$ of the IC socket 10 is mounted on (electrically connected to) the IC socket 10.

The pseudo device 12 contains a connection line 12A for electrically Interconnecting the terminals $P_1$ and $P_N$ of the IC socket 10. By mounting the pseudo device 12 on the IC socket 10, the driver DR of the pin card 11A connected to the terminal $P_1$ is connected to the reference pin card 11N.

Then the delay time of the variable delay circuit DRY3 through which the strobe pulse $P_{STRB}$ is fed to the voltage comparator $CP_N$ is set at a previously known value. This previously known delay time is determined as a reference value and the strobe pulse $P_{STRB}$ is applied to the voltage comparator $CP_N$. Since the voltage comparator $CP_N$ is supplied with the driving signal $V_{DR}$ from the pin card 11A via the pseudo device 12, the rise timing and the fall timing of the driving signal $V_{DR}$, for instance, are measured using the strobe pulse $PS_{TRB}$ provided to the voltage comparator $CP_N$.

Figure 7:
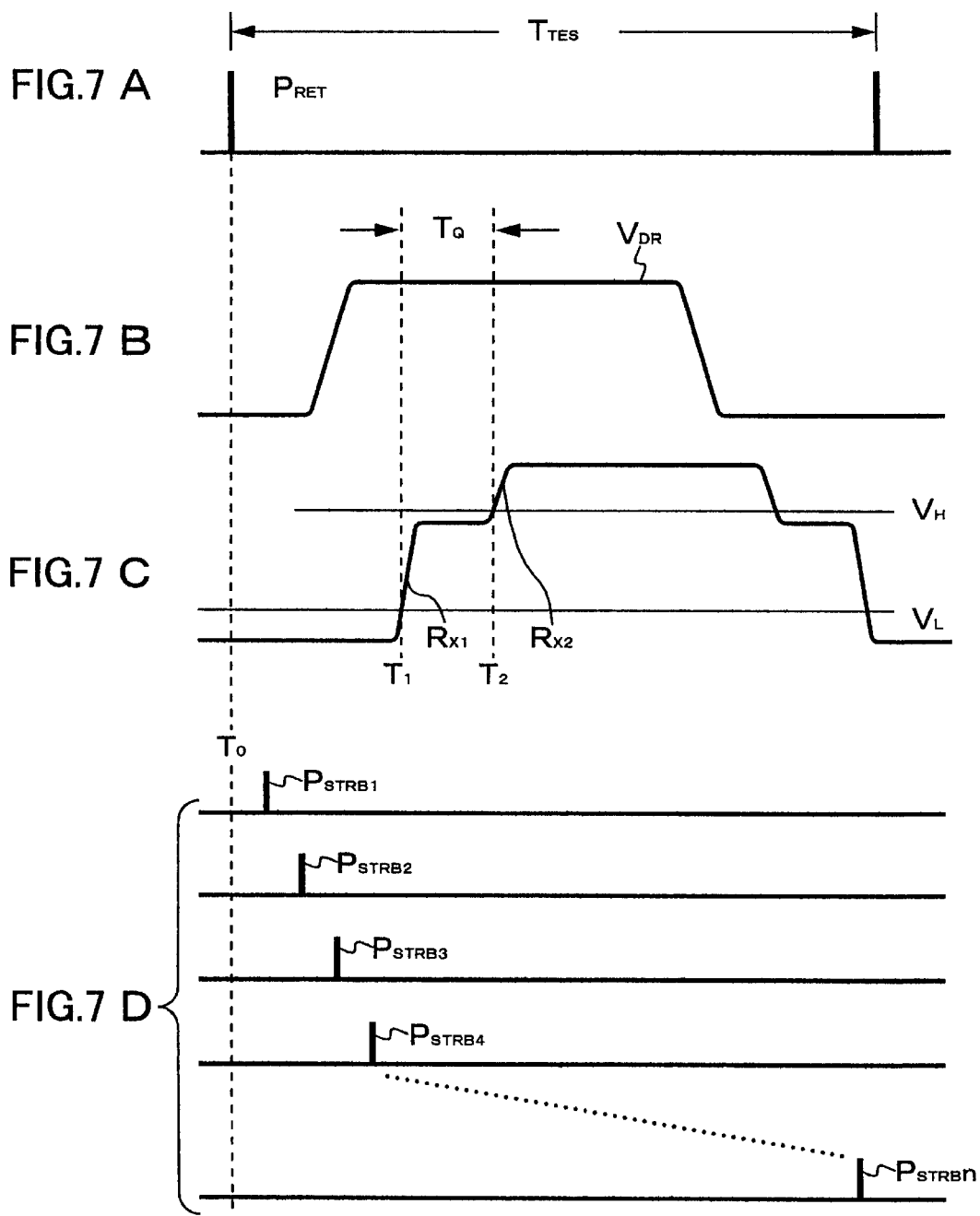
FIG. 7 is a waveform diagram for explaining how to make the skew adjustment on the driver side according to the conventional skew adjusting
Figure 8:
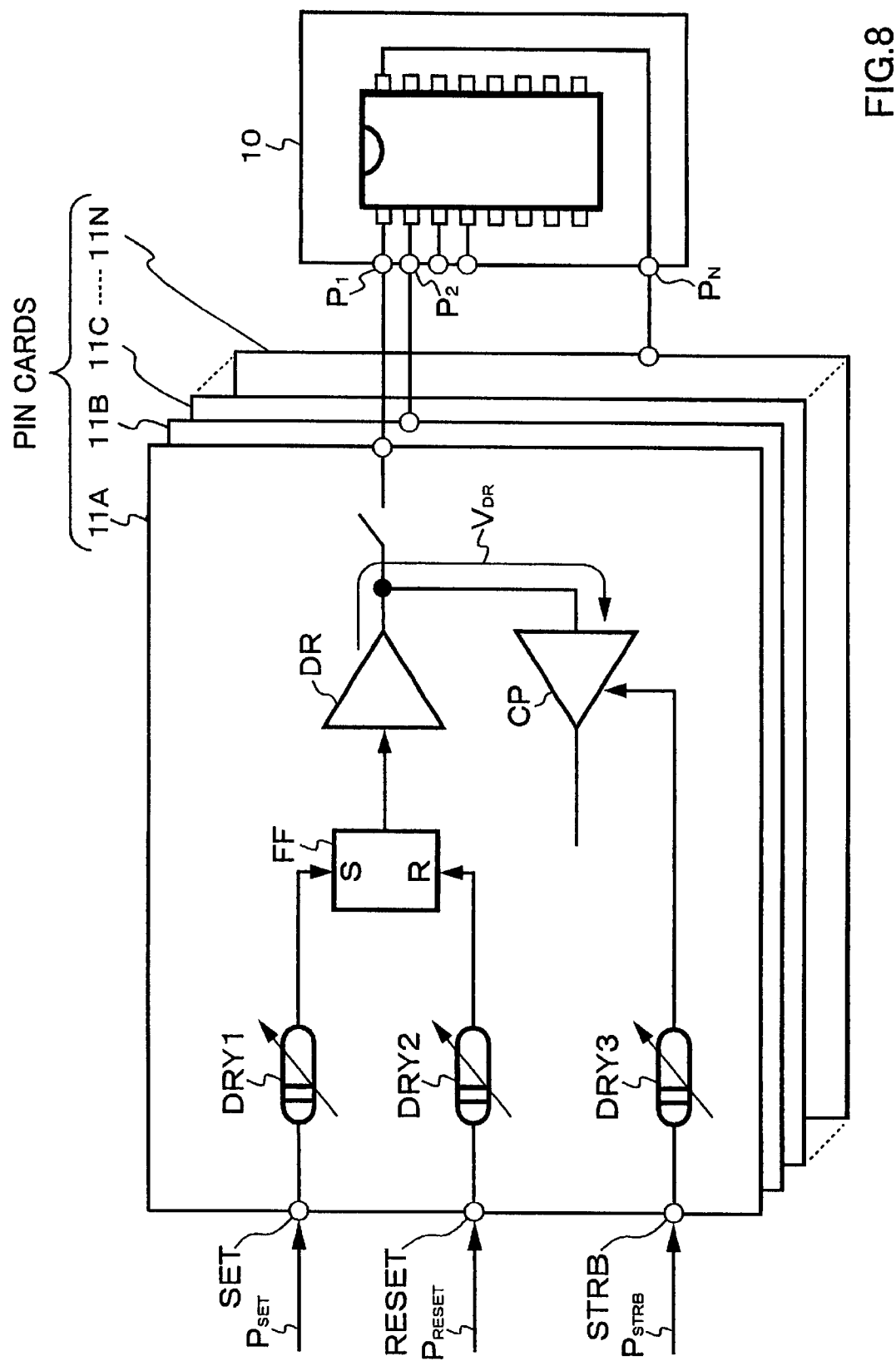
FIG. 8 is a block diagram illustrating a portion of an IC testing apparatus Including pin cards, for explaining how to make the skew adjustment on the voltage comparator side according to the conventional skew adjusting method.

More specifically, the rise and the fall timing of the driving signal $V_{DR}$ of the pin card 11A can be measured by shifting the phase of the strobe pulse $P_{STRB}$ little by little for each test period $T_{TES}$ as indicated by $P_{STRB1}$, $P_{STRB2}$, ..., $P_{STRBn}$ in FIG. 7D. The timing thus measured is used to detect delay times of the rise and the fall timing of the driving signal $V_{DR}$ of the pin card 11A.

Figure 2:
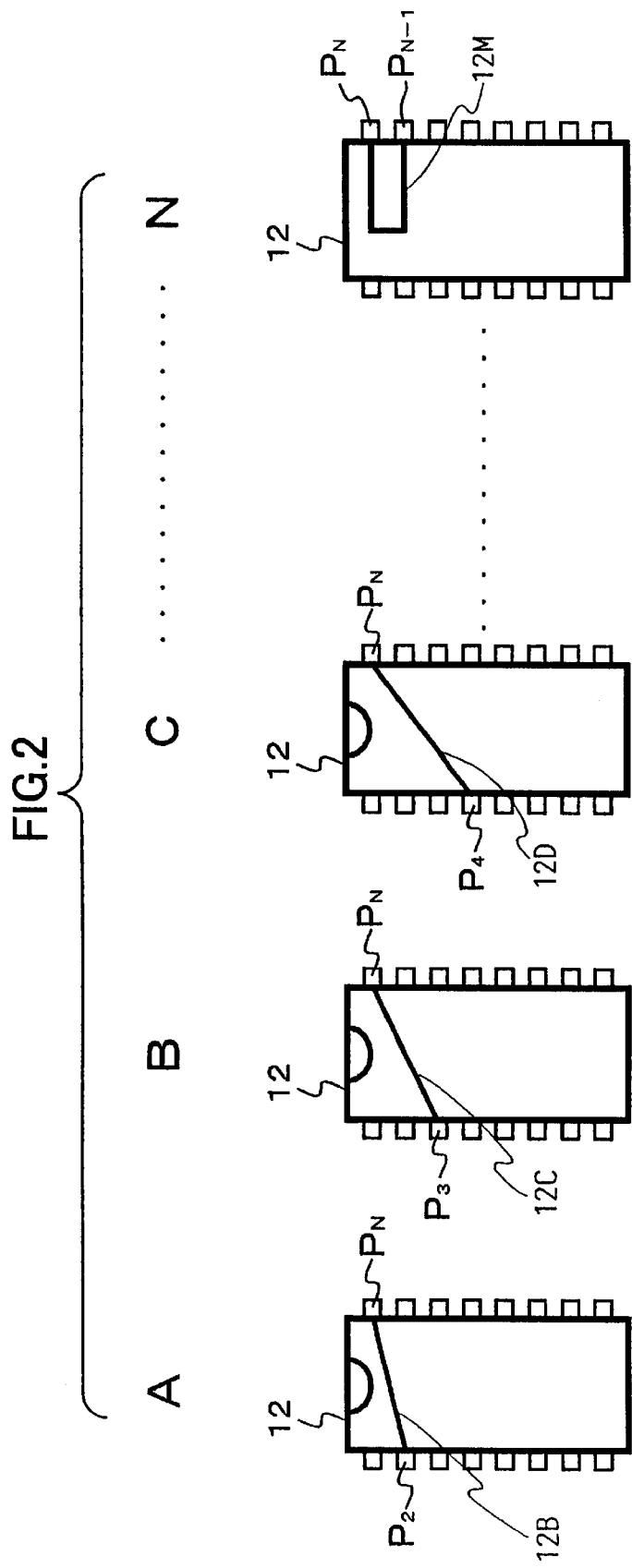
FIG. 2 is a plan view illustrating an embodiment of a pseudo device useful for the skew adjusting method according to the present invention.
Figure 3:
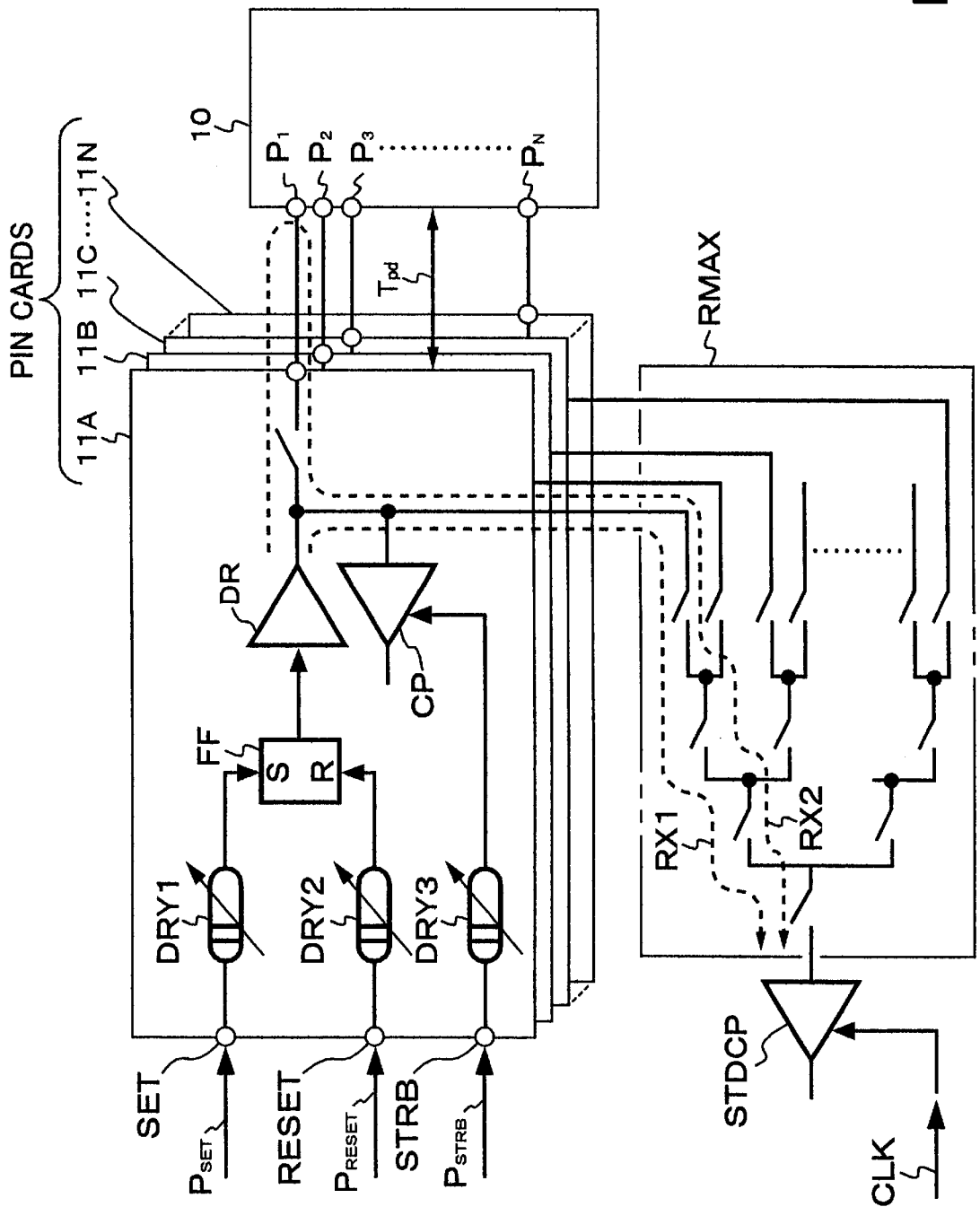
FIG. 3 is a block diagram illustrating a portion of an IC testing apparatus including pin cards, for explaining a conventional skew adjusting method.

FIG. 2 illustrates embodiments of the pseudo devices 12 that are each mounted on the IC socket 10. In FIG. 2, A shows a pseudo device 12 that contains a connection line 12B for interconnecting the terminals $P_2$ and $P_N$ of the IC socket 10, B a pseudo device 12 that contains a connection line 12C for interconnecting the terminals $P_3$ and the $P_N$ of the IC socket 10, C a pseudo device 12 that contains a connection line 12D for interconnecting the terminals $P_4$ and the $P_N$ of the IC socket 10, and N a pseudo device 12 that contains a connection line 12M for Inter-connecting the terminals $P_{N-1}$ and $P_N$ of the IC socket 10.

After measuring the delay times on the driver DR side of the pin card 11A, the pseudo devices 12 depicted in FIGS. 2A to 2N are sequentially mounted on the IC socket 10, by which the remaining pin cards 11B to 11M are sequentially connected to the reference pin card 11N to measure the delay times on the driver DR side of the pin cards 11B to 11M. Based on the measured results of the delay times on the driver DR side of all the pin cards 11A to 11M except the reference pin card 11N, the delay times of the variable delay circuits DRY1 and DRY2 of the pin cards 11A to 11M are adjusted and set to fixed values.

Figure 4:
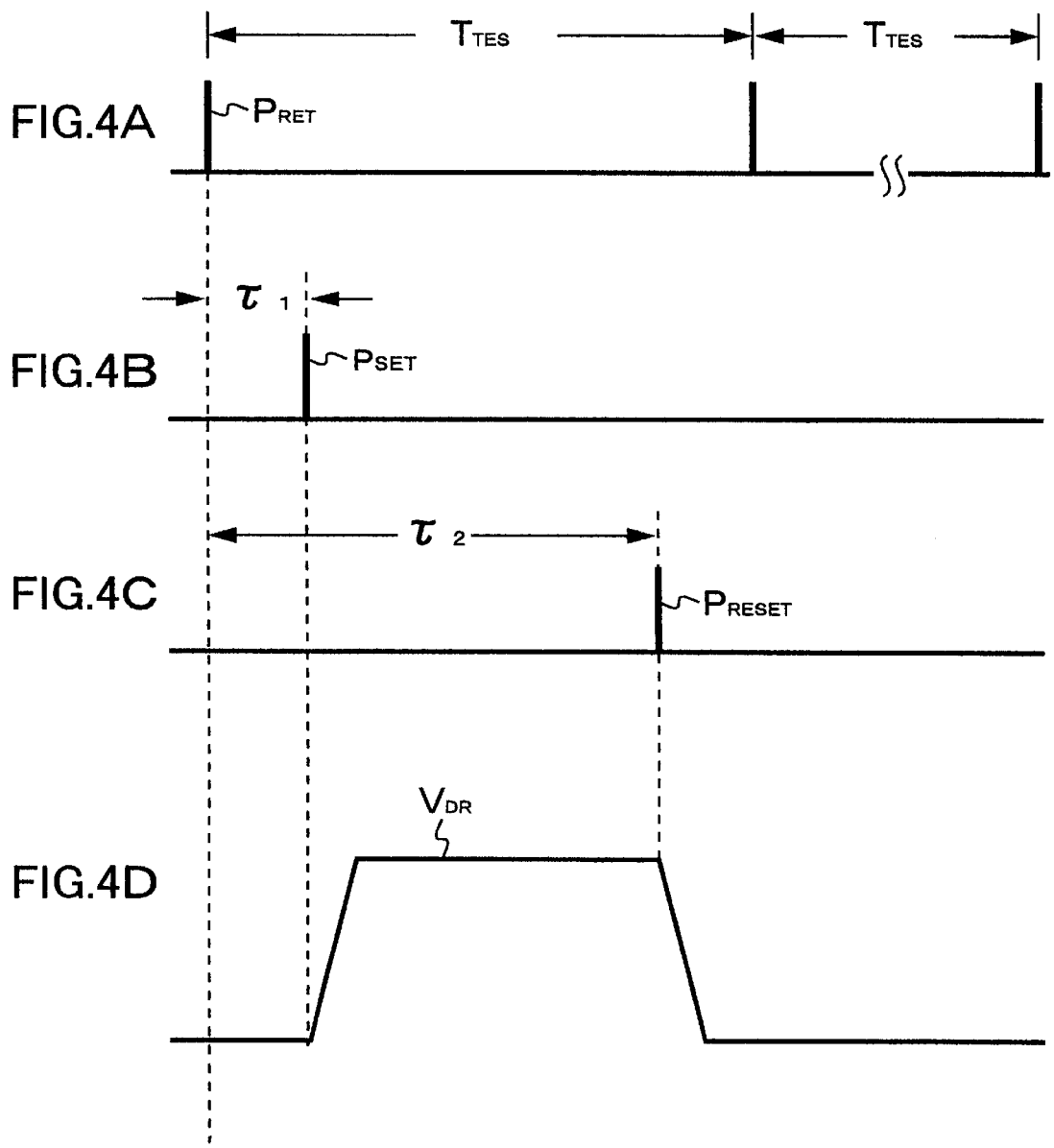
FIG. 4 is a waveform diagram for explaining the operation of the circuit depicted in FIG. 3.
Figure 5:
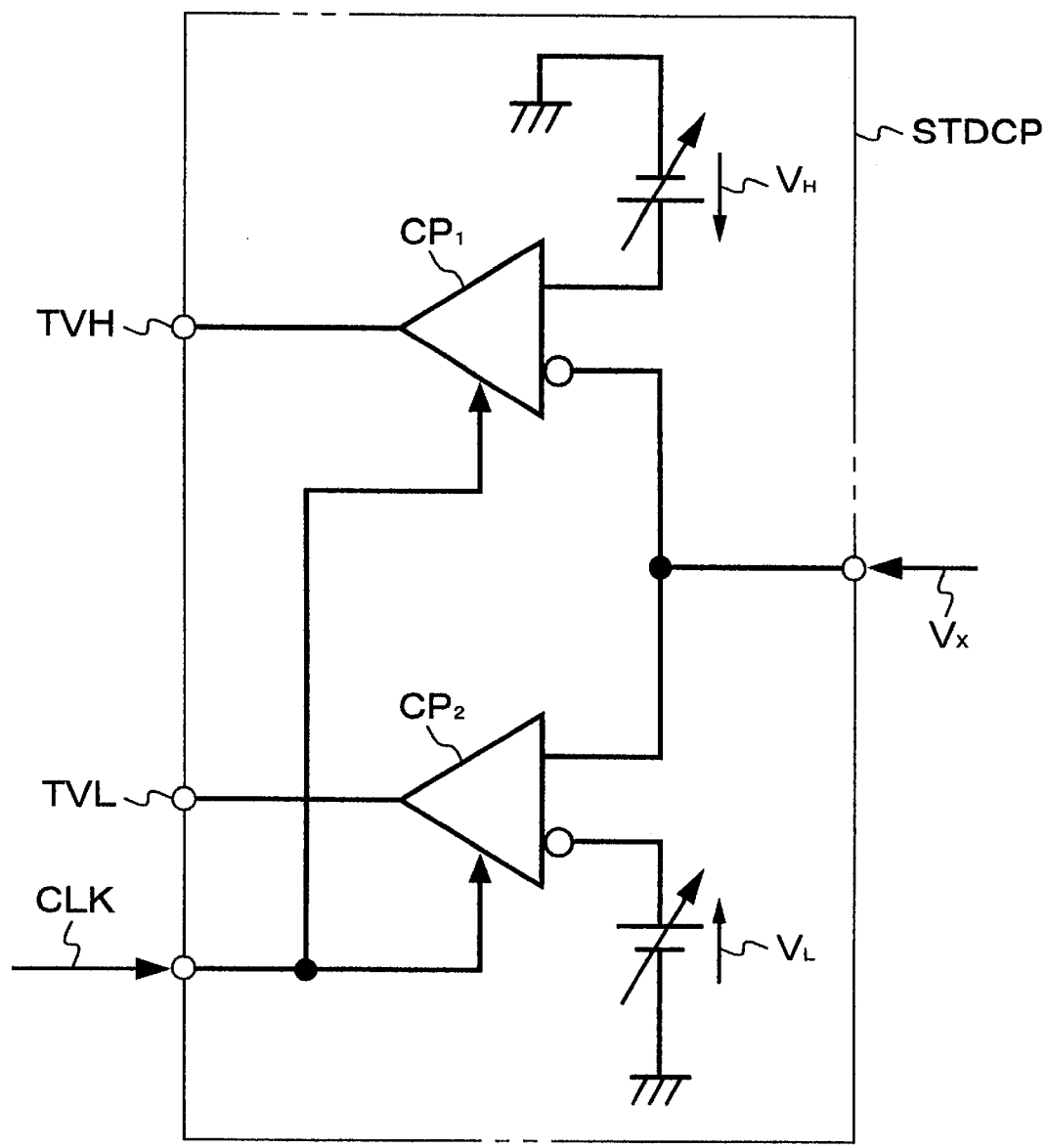
FIG. 5 is a circuit connection diagram depicting a concrete example of a standard reference comparator in the circuit shown in FIG. 3.
Figure 6:
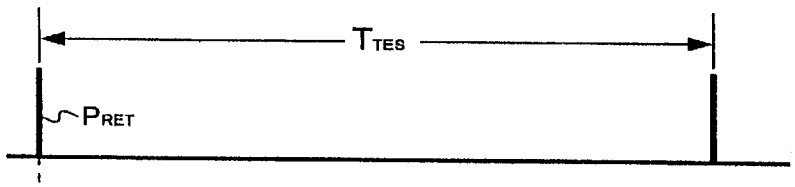
FIG. 6 is a waveform diagram for explaining the operation of the standard voltage comparator depicted in FIG. 5.
Figure 6:
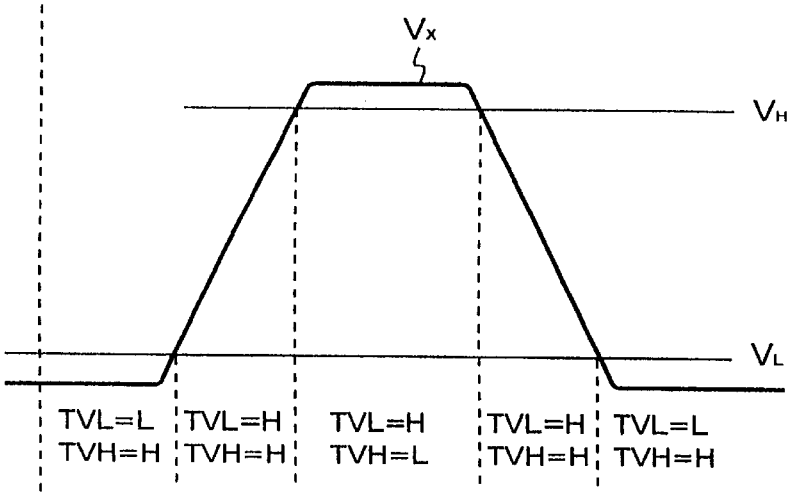
Figure 6:
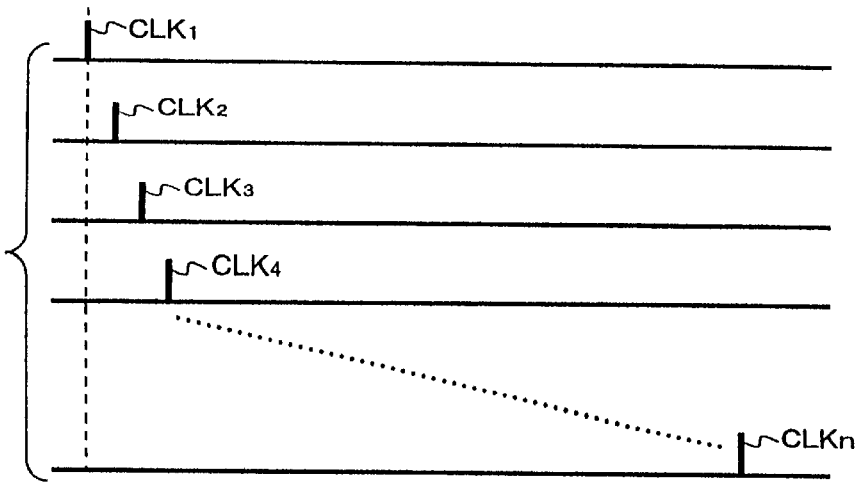

For example, when the measured values of the rise timing of the driving signal $V_{DR}$ from the driver DR of the pin cards 11A to 11M are somewhere between 7 and 13 ns about a preset delay time $\tau_1$ (corresponding to $\tau_1$ in FIG. 4), t1=10 ns which is their central value is set as a reference value. The delay times of the variable delay circuits DRY1 of the pin cards 11A to 11M are adjusted and set so that the rise timing of the driving signals $V_{DR}$ from these pin cards may be 10 ns.

The same is true of measured value of the fall timing of the driving signal $V_{DR}$. The central value of the measured results is similarly determined as a reference value. The delay times of the variable delay circuits DRY2 of the pin cards 11A to 11M are adjusted and set so that the fall timing of their driving signals $V_{DR}$ may coincide with the reference value (the central value).

Incidentally, the phase delay on the driver side of the reference pin card 11N can be adjusted by applying the driving signal $V_{DR}$ from the driver DR of the reference pin card 11N directly to the voltage comparator $CP_N$ to adjust the delay times of the variable delay circuits DRY1 and DRY2 so that the rise and the fall timing of the driving signal $V_{DR}$ may coincide with the above-mentioned reference values (central values).

After setting the delay times of the variable delay circuits DRY1 and DRY2 on the diver side, the delay time of the variable delay circuit DRY3 on the voltage comparator side of each pin card is adjusted and set accordingly. In this instance, too, any one of the pin cards 11A to 11N connected to the terminals $P_1$ to $P_N$ of the IC socket 10 is chosen as a reference pin card. In this embodiment, the pin card described to be chosen as the reference one for measuring the delay time on the driver DR side, that is, the pin card 11N connected to the terminal $P_N$ of the IC socket 10, is set as the reference pin card; it is needless to say, however, that any other pin card can be used as the reference pin card.

The driving signal $V_{DR}$ from the driver DR of the reference pin card 11N is fed to the voltage comparators $CP_A$ to $CP_M$ of all the remaining pin cards 11A to 11N by exchanging the pseudo devices 12 in a sequential order. The voltage comparators $CP_A$ to $CP_M$ of the pin cards 11A to 11M are used to measure, for instance, the rise timing of the reference driving signal $V_{DR}$, and the delay time of the variable delay circuit DRY3 of each of the pin cards 11A to 11M is adjusted so that the measured timing value may coincide with a preset value. With this adjustment all the skew adjustments are completed.

Incidentally, the phase delay on the voltage comparator $CP_N$ side of the reference pin card 11N can be adjusted by applying the driving signal $V_{DR}$ from the driver DR of the reference pin card 11N directly to the voltage comparator $CP_N$ to adjust the delay time of the variable delay circuit DRY3 so that the rise timing of the driving signal $V_{DR}$ may coincide with the above-mentioned preset fixed value. This may also be achieved by applying the driving signal from the driver of any one of the other skew-adjusted pin cards 11A to 11M to the voltage comparator $CP_N$ of the reference pin card 11N via the pseudo device 12 concerned.

According to the present invention described above, it is easy to accurately previously measure the signal propagation delay time from the reference pin card 11N to the corresponding terminal $P_N$ of the IC socket 10 and the signal propagation delay time in the pseudo device 12; these accurately previously measured values can be used to measure with high accuracy the propagation delay times between all the pin cards 11A to 11M except the reference pin card 11N and the corresponding terminals of the IC socket 10. The delay times of the variable delay circuits DRY1 and DRY2 of each pin card are set based on the accurately measured signal propagation delay time between the pin card and the corresponding terminal of the IC socket-this ensures accurate setting of the delay times of the variable delay circuits.

While in the above the number of pseudo devices 12, each containing one connection line through which the terminal $P_N$ of the IC socket 10 connected to the reference pin card 11N is connected to another terminal of the IC socket 10, is described to be smaller than the number of terminals of the IC socket 10 by one, the present invention is not limited specifically thereto. For example, in the circuit configuration which has a switch between the driver DR of the pin card and its output terminal as in the illustrated embodiment, it is possible to prepare pseudo devices each containing two or more connection lines through which the terminal $P_N$ of the IC socket 10 connected to the reference pin card 11N is connected to two or more other terminals of the IC socket 10 and to perform the skew adjustments by turning ON the switches of the pin cards one after another. This permits reduction of the number of times the pseudo devices are exchanged.

As will be appreciated from the above, the present invention does not use a circuit that is not required for actual measurements, and sets the delay times of variable delay circuits on the driver side of each pin card based on the accurately measured propagation delay time. Hence, the delay times set in the variable delay circuits are also accurate and the skew adjustment on the driver side can be made with high accuracy.

Furthermore, since the skew adjustment on the driver side of each pin card can be made accurately, it is also possible to accurately make the skew adjustment on the voltage comparator side of each pin card.

Accordingly, the present invention ensures accurate skew adjustments for all the pin cards, and hence it provides the advantage of enhanced reliability of test results.

While the present invention has been described with respect to the preferred embodiments illustrated herein, it will be apparent to those skilled in the art that various changes, alterations, modifications and minor improvements may be made to the embodiments described above without departing from the spirit and scope of the present invention. Accordingly, it should be understood that the present invention is not to be limited to the illustrated embodiments but encompasses all changes, alterations, modifications and minor improvements falling within the scope of the invention defined by the appended claims.

What is claimed is:

1. In an IC testing apparatus comprising a plurality of pin cards and at least one IC socket, each of said pin cards being provided with at least one driver for supplying a test pattern signal to an IC under test and comparator means for logically comparing a response output signal from the IC under test with a predetermined value, a method of adjusting a skew in each of said pin cards comprising the steps of:

defining the comparator means provided in any one of said pin cards as reference detecting means;

preparing a plurality of pseudo devices each of which electrically connects, when mounted on said IC socket, the pin card provided with said reference detecting means to at least one of the remaining pin cards through said IC socket; and sequentially mounting said plurality of pseudo devices on said IC socket to connect all of the remaining pin cards one after another to said reference detecting means, and adjusting the driving timing of the driver of each of the remaining pin cards to the detected timing of said reference detecting means.

2. The method according to claim 1, further comprising the steps of:

defining any one of the drivers of said pin cards, the driving timing thereof being adjusted to the detected timing of said reference detecting means, as a reference driver; and supplying a driving signal outputted from said reference driver to each of the remaining pin cards through an associated pseudo device, and adjusting the detected timing of the comparator means of each of the remaining pin cards to the driving timing of said reference driver.

3. A pseudo device for use in the skew adjusting method as set forth in claim 1 or 2, which has substantially the same configuration as that of the IC under test and is provided with at least one connection line built therein for connecting a specified terminal of said IC socket to at least one of the remaining terminals thereof when said pseudo device is mounted on said IC socket.

4. The method according to claim 1 or 2, wherein the comparator means of each of said pin cards is a voltage comparator for determining whether the response output signal outputted from the IC under test has a predetermined logical L voltage or logical H voltage, and said step of adjusting the driving timing of the driver of each of the remaining pin cards to the detected timing of said reference detecting means is a step of measuring the rise timing and the fall timing of the driving signal outputted from the driver of each pin card, and adjusting the driving timing of the driver of each pin card to a central value of the measured rise timings or the measured fall timings.

5. The method according to claim 1 or 2, wherein the number of said pin cards is equal to the number of terminals of said IC socket, and each of said plurality of pseudo devices is provided with one connection line built therein, said connection line connecting, when each pseudo device is mounted on said IC socket, the terminal thereof to which said pin card having said reference detecting means is connected to one of the remaining terminals of the IC socket through that pseudo device.

6. The method according to claim 1 or 2, wherein
defining the comparator means comprises setting the detected timing of said reference detecting means to a known value, and
adjusting the driving timing of the driver of a respective remaining pin card comprises:
measuring a delay time on the driver side of the respective remaining pin card relative to the detected timing of said reference detecting means; and
adjusting the delay time on the driver side of the respective remaining pin card to a fixed value based on the measured delay time on the driver side.

* * * * *